United States Patent
Suenaga et al.

(12) 
(10) Patent No.: US 6,445,025 B2
(45) Date of Patent: *Sep. 3, 2002

(54) SEMICONDUCTOR MEMORY DEVICE AND MANUFACTURING METHOD THEREOF

(75) Inventors: Kazufumi Suenaga; Kiyoshi Ogata, both of Yokohama; Kazuhiko Horikoshi, Kawasaki; Jun Tanaka, Chigasaki; Hisayuki Kato; Keiichi Yoshizumi, both of Kokubunji; Hisahiko Abe, Mito, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/848,420

(22) Filed: May 4, 2001

Related U.S. Application Data

(63) Continuation of application No. 09/288,672, filed on Apr. 9, 1999, now Pat. No. 6,239,457.

(30) Foreign Application Priority Data

Apr. 9, 1998 (JP) .......................................... 10-097117

(51) Int. Cl.$^7$ .................... H01L 29/76; H01L 27/108
(52) U.S. Cl. ................. 257/295; 257/295; 257/306; 257/310
(58) Field of Search .............................. 257/295, 306, 257/310

(56) References Cited

U.S. PATENT DOCUMENTS

| | | | | |
|---|---|---|---|---|
| 5,828,098 A | * | 10/1998 | Shimada et al. | ............ 257/310 |
| 5,973,911 A | | 10/1999 | Nishioka | |
| 6,143,597 A | * | 11/2000 | Matsuda et al. | ............ 438/240 |
| 6,144,057 A | * | 11/2000 | Yamazaki | .................... 257/306 |
| 6,239,457 B1 | * | 5/2001 | Suenaga et al. | ............ 257/295 |
| 6,285,048 B1 | * | 9/2001 | Azuma et al. | .............. 257/295 |

FOREIGN PATENT DOCUMENTS

| | | |
|---|---|---|
| JP | 6-151601 | 5/1994 |
| JP | 7-142600 | 6/1995 |
| JP | 10012832 | 1/1998 |

OTHER PUBLICATIONS

"Preparation And Electrical Properties Of High Quality PZT Thin Films On RuOx Electrode", Lee et al., Integrated Ferroelectrics, 1995, vol. 10, pp. 145–154.

"Integrated Ferroelectrics, 1995", vol. 10, pp. 145–154.

"Large–Sized Sample SPM Observation System Operation Guide", (published by Tokyo Technica), Apr. 1996.

"The whole of Non–erasable IC Memory RAM" (edited by Tomoji Kawai, published by Kougyou Chousa Kai, 1996), pp. 202–219.

"Ferroelectric, Thin Film Memory" (published by Science Forum, 1995).

Text of Realize Corporation's Advanced Technical Lecture entitled "Advanced Technology of Nonvolatile Ferroelectric Thin Film Memory and Problem Associated with Process Technology (Realize Corporation, 1996)".

* cited by examiner

*Primary Examiner*—Eddie Lee
*Assistant Examiner*—Joseph Nguyen
(74) *Attorney, Agent, or Firm*—Antonelli, Terry, Stout & Kraus, LLP

(57) ABSTRACT

The present invention is a high quality semiconductor memory device using a ferroelectric thin film capacitor as a memory capacitor at a high manufacturing yield, the ferroelectric thin film of the capacitor is specified such that the relative standard deviation of crystal grain sizes is 13% or less, to thereby ensure a high remanent polarization value and a small film fatigue (large rewritable number).

6 Claims, 10 Drawing Sheets

TOP VIEW

ENLARGED TOP VIEW

SEMICONDUCTOR MEMORY DEVICE AND MANUFACTURING METHOD THEREOF

CROSS-REFERENCE TO RELATED APPLICATION

This application is a continuation of application Ser. No. 09/288,672, filed on Apr. 9, 1999 now U.S. Pat. No. 6,239,451, the entire disclosure of which is hereby incorporated by reference.

BACKGROUND OF THE INVENTION

The present invention relates to a semiconductor memory device using a ferroelectric thin film, which is most suitable for a ferroelectric nonvolatile memory or high density DRAM, and to a method of manufacturing the semiconductor memory device.

(1) A conventional ferroelectric thin film capacitor has, as described in "Ferroelectric Thin Film Memory"(published by Science Forum, 1995), page 227, a stacked structure of Pt upper electrode/ferroelectric layer (PZT)/Pt lower electrode.

(2) Based on a surface observation photograph by a scanning electron microscope for a PZT ferroelectric thin film crystallized on a lower electrode, described in Integrated Ferroelectrics, 1995, Vol. 10, pp. 145–154, an average crystal grain size is about 180 nm and a relative standard deviation of crystal grain sizes is about 15%.

(3) In a method of forming a thin film described in Japanese Patent Laid-open No. Hei 7-142600, a compound of $BaTiO_3$ is formed on a Pt thin film, whereby orientation of a ferroelectric thin film is controlled by allowing crystal orientation of the ferroelectric thin film to follow that of the Pt thin film, to thereby ensure remanent polarization.

(4) In an oriented ferroelectric thin film described in Japanese Patent Laid-open No. Hei 6-151601, an epitaxial or oriented buffer layer having a two-layer structure on a semiconductor single crystal substrate and an epitaxial or oriented perovskite $ABO_3$ type ferroelectric substance is formed thereon, to obtain a highly oriented ferroelectric thin film.

In the above references, description is made of the nonvolatile memories using a ferroelectric substance as a capacitor. The problems to be examined, however, are also present in DRAMs using a ferroelectric substance as a capacitor.

(5) For example, as described in "Ferroelectric Thin Film Integration Technology"(published by Science Forum, 1992), pages 13–16, for a 256 Mb DRAM or the like, an attempt has been made to use a crystal thin film made from a high dielectric constant material such as $BaSrTiO_3$ or the like for a capacitor.

In the above-described references (1) and (2), it is difficult to control the crystal grain size and orientation of the ferroelectric thin film. When such a ferroelectric thin film is patterned to form a memory capacitor, a variation in characteristics between memory cells becomes large because of a large variation in crystal grain size, a larger variation in crystal orientation, and a larger surface roughness of each of the ferroelectric thin film and an electrode. This makes it difficult for all of the memory cells to equally obtain sufficient characteristics, giving rise to a problem in exerting adverse effect on the stability in manufacturing yield.

In the above-described reference (3), a variation in orientation is reduced; however, since a variation in grain size of crystal grains in a memory cell is large, a leakage current occurs, an effective voltage between capacitors is reduced because of concentration of an electric field at a grain boundary portion present in the thin film in the film thickness direction, or remanent polarization becomes uneven, which results in degradation of the performance of the memory cell.

SUMMARY OF THE INVENTION

An object of the present invention is to solve the above-described problems, and to provide a ferroelectric thin film capacitor capable of reducing a variation in characteristics between memory cells, thereby realizing a highly integrated ferroelectric memory having an enhanced performance at an improved manufacturing yield.

To solve the above problems, according to the present invention, there is provided a semiconductor memory device using, as a memory capacitor, a ferroelectric thin film capacitor composed of a stacked structure having at least a lower electrode, a ferroelectric thin film and an upper electrode formed on a substrate, wherein a relative standard deviation of crystal grain sizes of crystal grains of the ferroelectric thin film is controlled at a value of 13% or less; the crystal grains are formed into columnar shapes elongated in the film thickness direction; and the columnar crystal grains have no grain boundary in the film thickness direction. With this configuration, it is possible to prevent occurrence of a leakage current and also to prevent a reduction in effective voltage applied between capacitors due to concentration of an electric field in the ferroelectric thin film or at an interface between the ferroelectric thin film and an electrode.

The lower electrode of the above capacitor may be configured as a Pt electrode or a Pt alloy electrode, and the lower electrode may be formed such that the (111) faces of crystal grains are preferentially oriented in the direction perpendicular to a substrate plane. This makes it possible to improve the orientation of a ferroelectric thin film formed on the lower electrode, and hence to further enhance the uniformity between memory cells. The lower electrode may be also made from a compound containing a material such as Ru, Ir, an oxide thereof or Pt, and an element contained in the ferroelectric thin film. In this case, the same effect as that described above can be achieved.

An $ABO_3$ type oxide having a perovskite structure may be used as the ferroelectric material and the ferroelectric thin film may be formed such that the (111) faces of crystal grains are preferentially oriented in the direction perpendicular to the substrate plane. With this configuration, it is possible to reduce the non-uniformity in characteristics due to a variation in orientation. By use of an $ABO_3$ type ferroelectric substance having a composition $[A=Pb, B=(Zr_{1-x}, Ti_x)]$, there can be obtained a ferroelectric thin film having a large remanent polarization, which film is desirable for a nonvolatile memory. Further, by use of an $ABO_3$ type ferroelectric substance having a composition $[A =(Ba_{1-x}, Sr_x), B=Ti]$, there can be obtained a ferroelectric thin film exhibiting no hysteresis at a memory service temperature, which film is desirable for a capacitor of a DRAM or the like. A ferroelectric thin film can be made from a material having a composition at least part of which contains a crystalline $ABO_3$ type oxide, an amorphous $ABO_3$ type oxide, or a mixture thereof, where A is at least one element selected from a group consisting of Pb, La, Sr, Nd and Ba; B is at least one element selected from a group consisting of Zr, Ti, Mn, Mg, Nb, Sn, Sb and In; and O is oxygen.

According to the present invention, there is provided a method of reducing the relative standard deviation of crystal grain sizes of crystal grains of a ferroelectric thin film by forming micro-nuclei necessary for growth of the crystal grains on the lower electrode with less variation. The method includes the steps of forming initial nuclei made from at least one or more of metals contained in a ferroelectric thin film to be formed or an oxide or compound containing the metals, or heat treating the lower electrode after formation thereof at a high temperature to precipitate at least one or more of metals contained in an adhesive layer (provided between the lower electrode and a CMOS substrate) or an oxide or compound containing the metals on the surface of the lower electrode, thereby forming initial nuclei necessary for formation of micro-nuclei; and forming and crystallizing a ferroelectric thin film on the initial nuclei layer to a thickness required for a semiconductor device. With this configuration, there can be obtained a ferroelectric capacitor in which the relative standard deviation of the crystal grain sizes is small, the (111) faces of the crystal grains are preferentially oriented in the direction perpendicular to the substrate plane, and the surface roughness is small.

Alternatively, the above initial nuclei layer to be formed on the surface of the lower electrode may be made from an $ABO_3$ type oxide having a perovskite structure where A=Pb, B=($Zr_{1-x}$, $Ti_x$) or A=($Ba_{1-x}$, $Sr_x$), B=Ti, or made from Ti, $TiO_x$, Sr or $SrO_x$. The initial nuclei can be made from a material having a composition at least part of which contains a crystalline $ABO_3$ type oxide, an amorphous $ABO_3$ type oxide, or a mixture thereof, where A is at least one element selected from a group consisting of Pb, La, Sr, Nd and Ba; B is at least one element selected from a group consisting of Zr, Ti, Mn, Mg, Nb, Sn, Sb and In; and O is oxygen. With this configuration, there can be obtained a ferroelectric thin film in which the crystal grain sizes are small and the relative standard deviation of the crystal grains is small. The ferroelectric thin film thus obtained is advantageous in suppressing growth of crystal grains having the pyrochlore structure and rosette-shaped $ZrO_x$ crystal grains causing deterioration of ferroelectric characteristics, and ensuring properties most suitable for a nonvolatile memory, that is, a large remanent polarization value, a small leakage current, and a small film fatigue (reduction in remanent polarization due to rewriting).

DETAILED DESCRIPTION OF THE PREFERRED EMBODIMENTS

Hereinafter, embodiments of the present invention will be described in detail.

(1) Semiconductor Memory Device on Which Ferroelectric Thin Film is Mounted

Figure 10:
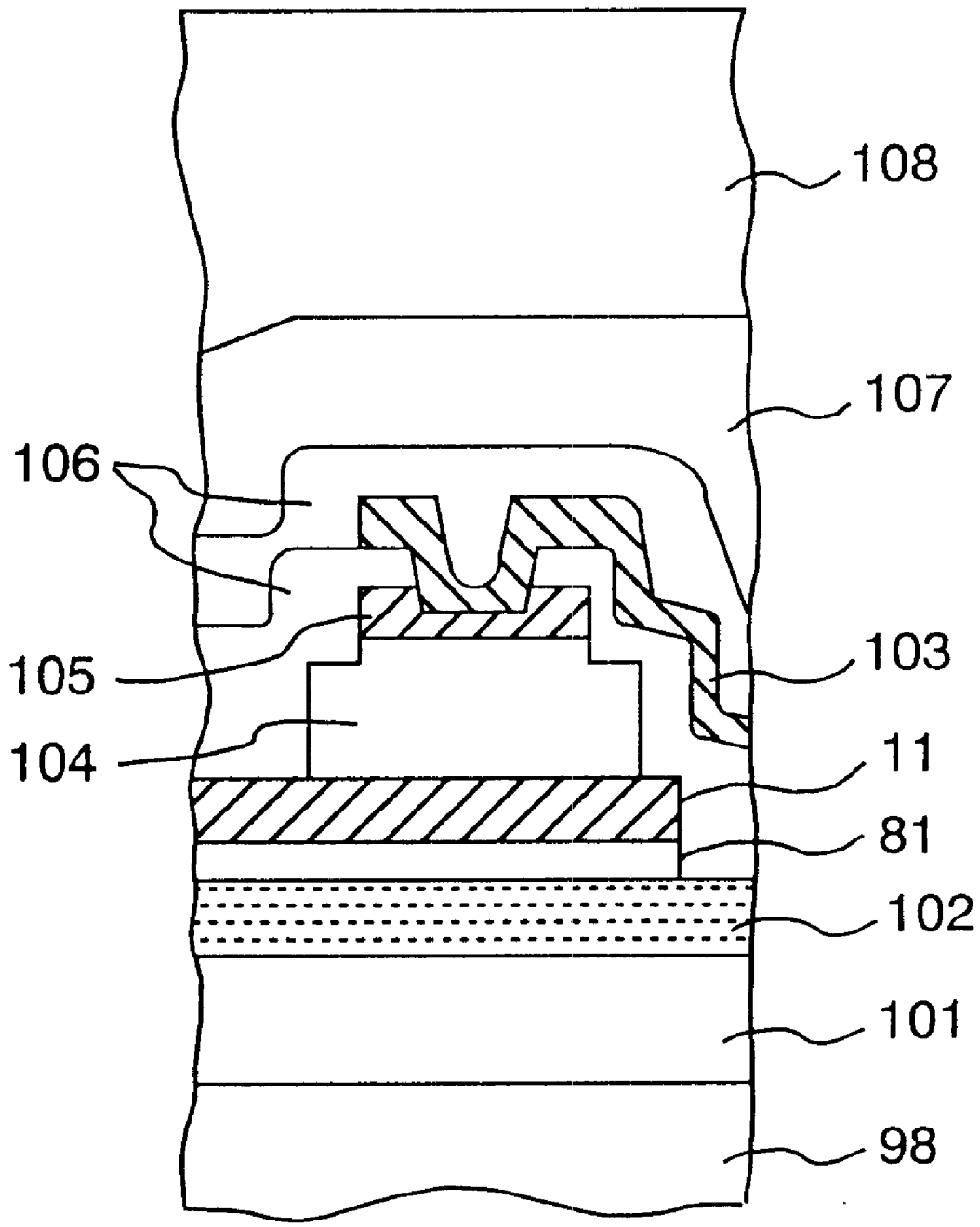
FIG. 10 is a sectional view showing the schematic configuration of a capacitor portion of a semiconductor memory device using a ferroelectric thin film according to one embodiment of the present invention.

FIG. 10 is a sectional view showing the schematic configuration of a capacitor portion of a semiconductor memory device using a ferroelectric thin film according to one embodiment of the present invention. Symbol's number 98 is a Si substrate. Symbol's number 101 is an underlayer LSI. Symbol's number 102 is an insulating layer. Symbol's number 81 is an adhesive layer. Symbol's number 11 is a lower electrode. Symbol's number 104 is a ferroelectric layer. Symbol's number 105 is an upper electrode. Symbol's number 103 is an interconnection layer (a wiring layer). Symbol's number 106 is an interlayer insulating layer. Symbol's number 107 is a protective layer. Symbol's number 108 is a sealing resin. A CMOS, which will be taken as a transistor portion of a memory cell, is formed on a Si substrate 98, and an insulating layer 102 for planarization, insulation and protection of the CMOS. In this embodiment, as the insulating layer 102, a $SiO_2$ glass film called a BPSG film is formed to a thickness of 300 nm. A ferroelectric capacitor is formed on the $SiO_2$ insulating layer 102. The ferroelectric capacitor has a stacked structure of a Ti adhesive layer 81 (20 nm), a Pt lower electrode 11 (200 nm), an inventive ferroelectric substance $Pb_{(1+y)}(Zr_{1-x}, Ti_x)O_3$ layer 104 (250 nm) containing crystal grains in which a relative standard deviation of crystal grain sizes is 13% or less (not more than 13%), and an upper electrode 105 (10 nm). An interlayer insulating layer 106 and an interconnection layer 103 for interconnecting the capacitor electrode 105 to the transistor are stacked on the capacitor, and another interlayer insulating layer 106 is formed on the interconnection layer 103. A protective layer 107 made from $SiO_2$ or the like is formed on the interlayer insulating film 106. Finally, the entire structure is packaged by a sealing resin 108.

Figure 1A:
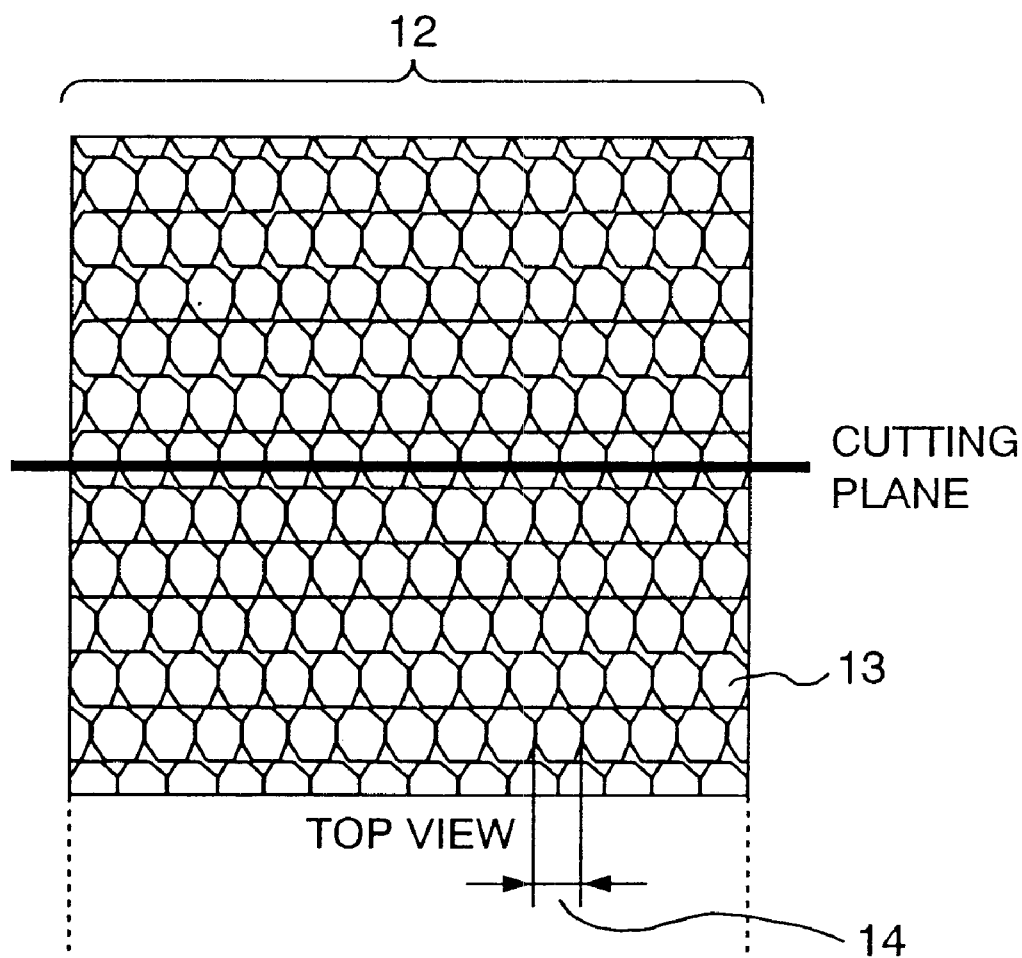
FIG. 1A is a top view showing the schematic configuration of a capacitor portion of a semiconductor memory device using a ferroelectric thin film in which the relative standard deviation of crystal grain sizes is 13% or less according to one embodiment of the present invention.
Figure 1B:
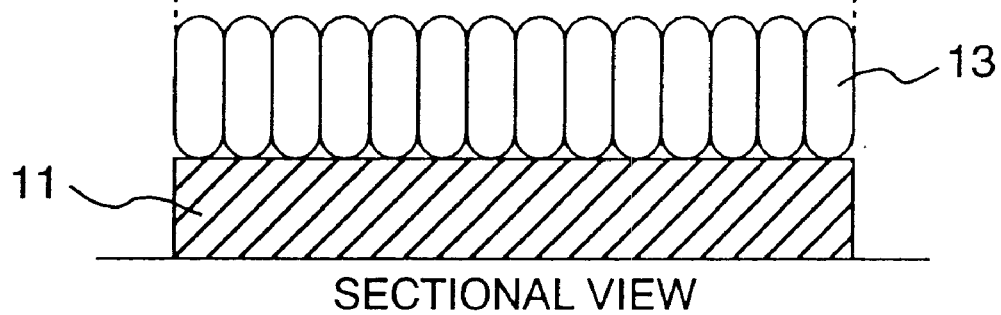
FIG. 1B is a sectional view of FIG. 1A.

(2) Relative Standard Deviation of Crystal Grain Sizes of Ferroelectric Thin Film FIG. 1 is a view showing the schematic configuration view of a capacitor portion of a semiconductor memory device using a ferroelectric thin film 12 formed on a lower electrode 11 according to one embodiment of the present invention, wherein the ferroelectric thin film [Pb(Zr,Ti)o$_3$ (PZT)] 12 has crystal grains 13 in which a relative standard deviation of crystal grain sizes is 13% or less (not more than 13%). In the figure, FIG. 1A shows the top view, and FIG. 1B shows the sectional view taken on a cutting plane of the top view of FIG. 1A. Here, a variation in the crystal grain sizes 14 of the crystal grains 13 is defined as a relative standard deviation a (unit: %) expressed by Numerical Formula 1. Depending on the large or small magnitude of the relative standard deviation σ, it can be decided whether or not the crystal grain sizes 14 are uniform.

$$\sigma = 100 \times \left( \sqrt{\frac{\sum_{i=1}^{N} (a_i - a_i(\text{ave}))^2}{N}} \right) \Big/ a_i(\text{ave}) \quad (1)$$

σ: variation in crystal grain sizes (relative standard deviation)

Figure 2A:
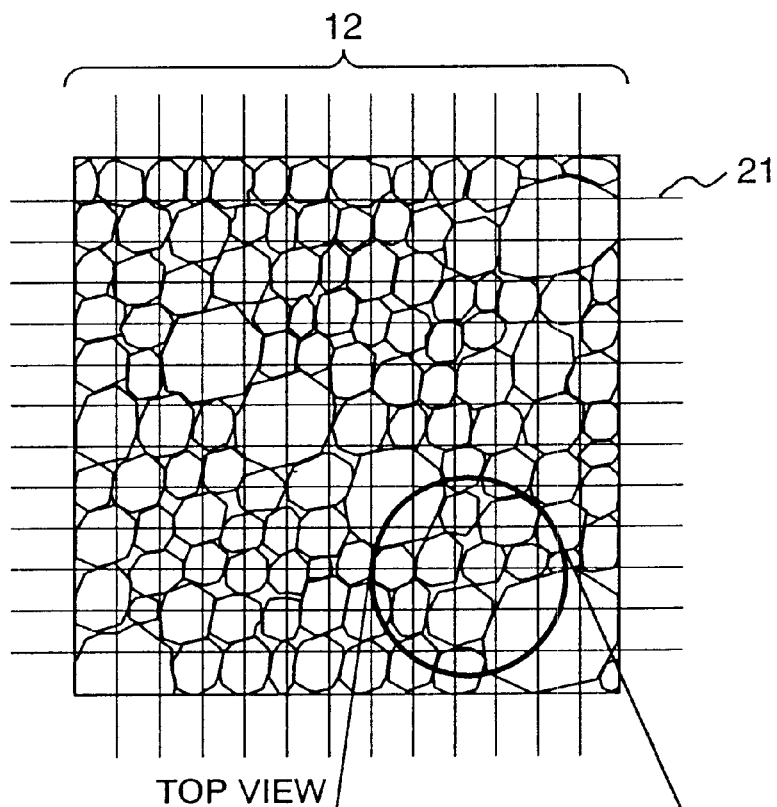
FIG. 2A is a top view illustrating a method of measuring crystal grain sizes of a ferroelectric thin film in an observation image (size: 1$\mu$m×1$\mu$m) obtained by an AFM according to one embodiment of the present invention.
Figure 2B:
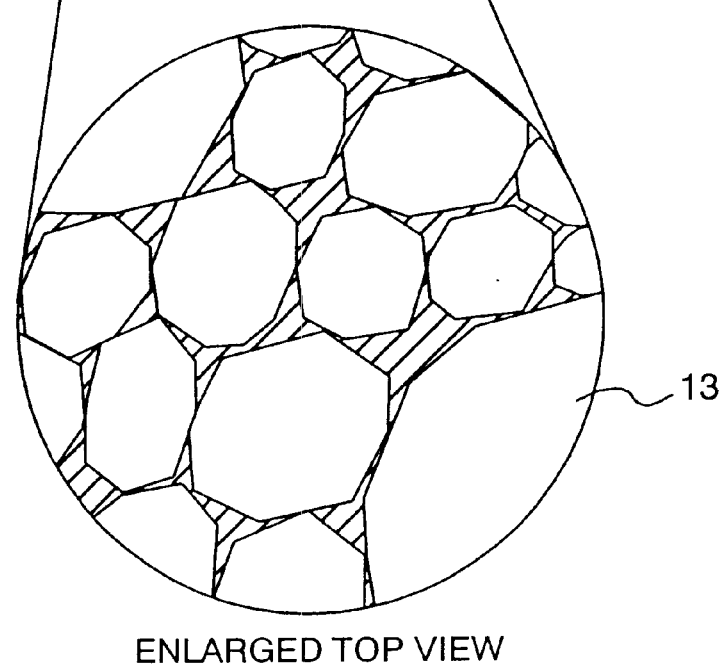
FIG. 2B is an essential portion enlarged view of FIG. 1A.

$N_i$: number of crystal grains contained in scanning line $L_i$: length of scanning line $a_i$: average crystal grain size in one scanning line $a_i$: $L_{i/Ni}$ N: number of scanning lines $a_i$(ave): average crystal grain size in scanning lines of N pieces $a_i$ (ave): $a_i/N$ The relative standard deviation of crystal grain sizes was analyzed by taking up a surface image or cross-sectional image of the ferroelectric thin film using a scanning electron microscope (SEM), an interatomic force microscope (AFM) or a cross-section transmission electron microscope (TEM), measuring crystal grain sizes of crystal grains within a plane having the normal line in the thickness direction of the ferroelectric thin film, and calculating the relative standard deviation σ of the crystal grain sizes. FIG. 2 shows a method of measuring crystal grain sizes according to one embodiment. Straight lines (crystal grain size calculating scanning lines 21) are set in the vertical and horizontal directions on an observation image (size: 1 μm ×1 μm) of the ferroelectric thin film obtained by an AFM (atomic force microscope). Then, the number of crystal grains is counted for each scanning line. The formula for calculating the relative standard deviation of crystal grain sizes is shown in Numerical Formula 1. By substituting the counted number of crystal grains in Numerical Formula 1, an average crystal grain size and a relative standard deviation are obtained. The AFM used for this analysis is a scanning probe microscope (trade name: Nano Scope III, produced by Digital Instrument Corporation in USA). The radius of curvature of the tip of a probe of the AFM is 10 nm and the taper angle of the tip of the probe is 35°. In the case of using the probe, when a gap between two adjacent ones of crystal grains on the uppermost surface is 80 nm, the critical penetration depth of the probe is 110 nm. In this embodiment, the AFM measurement was performed in a tapping mode. The details of the principle of the tapping mode are described in "Large-sized Sample SPM Observation System Operation Guide" (April, 1996) published by Touyo Technica.

Figure 3:
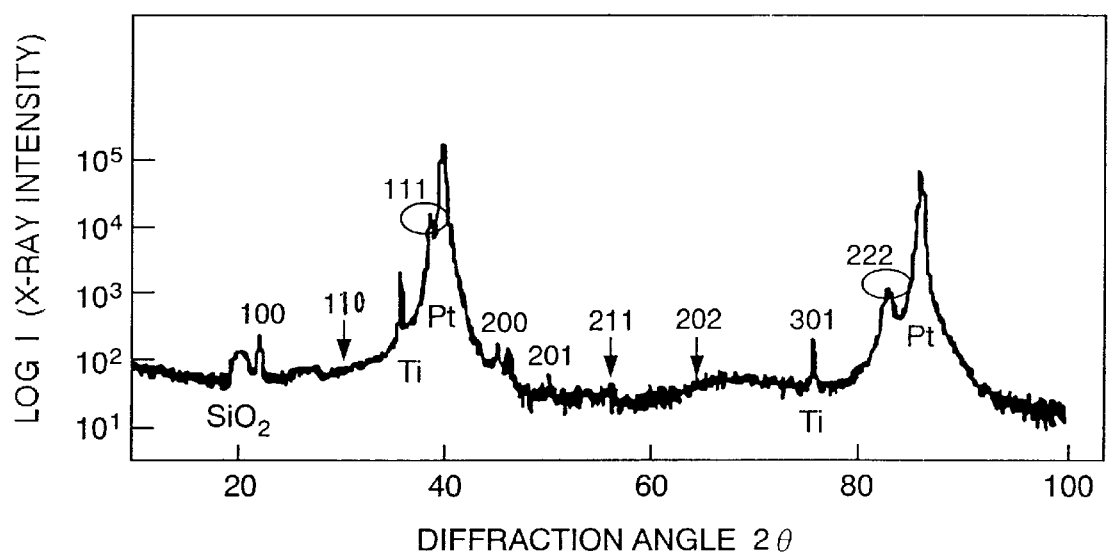
FIG. 3 is an X-ray diffraction diagram showing the result of X-ray diffraction of a ferroelectric capacitor in a semiconductor memory device according to one embodiment of the present invention.

FIG. 3 shows an X-ray diffraction pattern of a PZT ferroelectric thin film of the present invention, wherein the abscissa designates the diffraction angle 2θ and the ordinate designates the X-ray diffraction intensity (Log I). As a measuring device, there was used a powder X-ray diffraction device using an X-ray vessel having a cutarget as an X-ray source. In this measurement for the ferroelectric thin film, diffraction peaks 111 and 222 were measured, and other diffraction peaks 100, 110, 200, 201, 211, 202, and 301 were little measured. As a result, it was revealed that the ferroelectric thin film of the present invention is formed such that the (111) faces of crystal grains are preferentially oriented in the direction perpendicular to the substrate plane. In addition, diffraction peaks 111 and 222 of the Pt electrode and a diffraction peak corresponding to the Ti underlayer were observed.

Figure 4A:
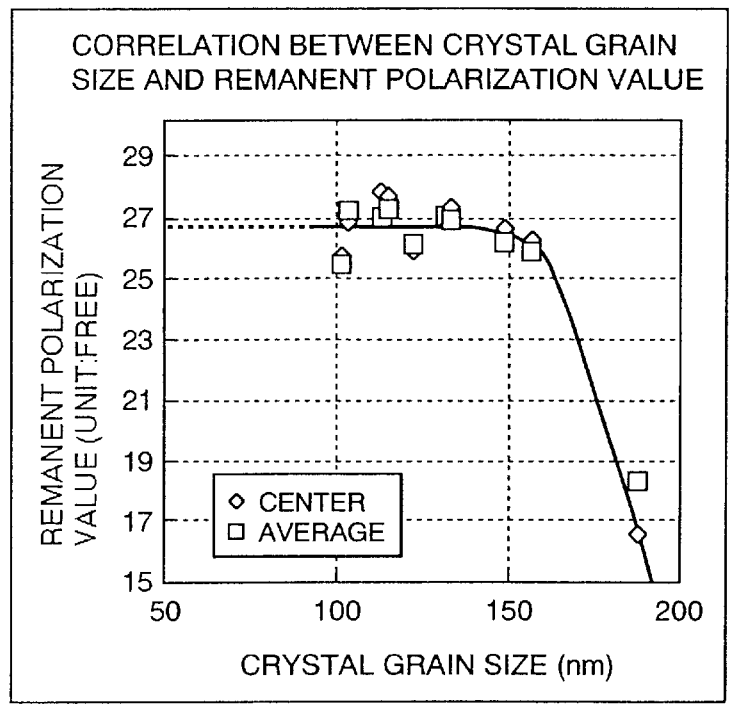
FIGS. 4A and 4B are diagrams showing a correlation between an average crystal grain size "a" and a remanent polarization value P according to one embodiment of the present invention, and a diagram showing a correlation between an average crystal grain size "a" and a film fatigue according to one embodiment of the present invention.
Figure 4B:
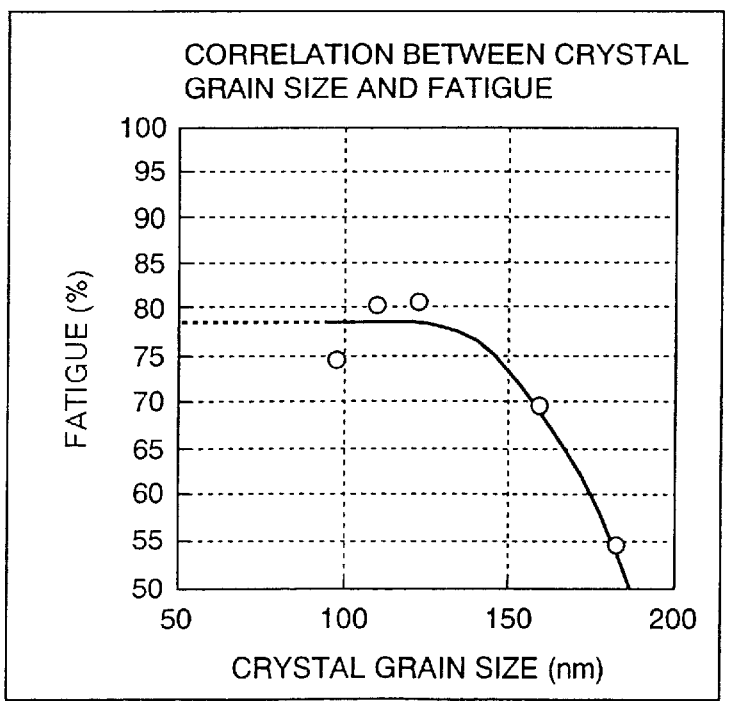

FIGS. 4A and 4B show a correlation between an average crystal grain size "a" and a remanent polarization value P and a correlation between the average crystal grain size "a" and a film fatigue, respectively. The film fatigue is defined as a percent value (unit: %) obtained by dividing a remanent polarization value after repeating writing $10^8$ times by the initial remanent polarization value before writing. When the film fatigue is small, the rewritable number is large, while when the film fatigue is large, the rewritable number is small. It should be noted that the physical meaning and definition of each of the remanent polarization value P and film fatigue and further a measuring/analyzing method thereof are described in "Ferroelectric Thin Film Memory" (published by Science Forum, 1995) and various textbooks associated with ferroelectric materials. As is apparent from FIGS. 4A and 4B, for an average crystal grain size more than 80 nm, as the crystal grain size becomes smaller, the remanent polarization value P becomes larger and the film fatigue becomes smaller (that is, the rewritable number becomes larger), while for an average crystal grain size equal to or less than 80 nm, the remanent polarization value P is kept at a specific large value and the film fatigue is kept at a specific small value (that is, the rewritable number is kept at a specific large value).

Figure 5A:
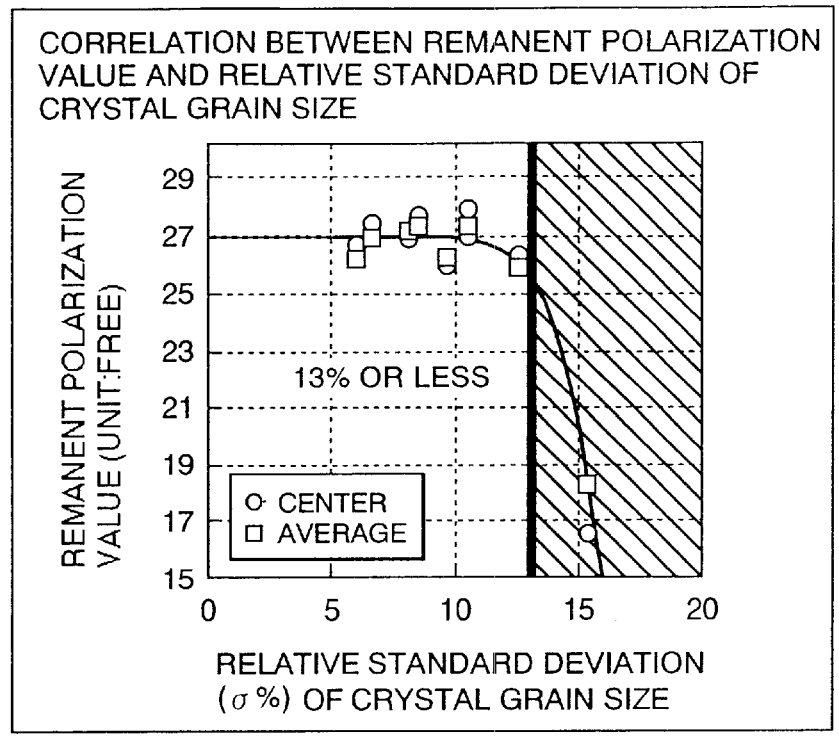
FIGS. 5A and 5B are diagrams showing a correlation between a relative standard deviation σ of crystal grain sizes of a ferroelectric thin film and a remanent polarization value P according to one embodiment of the present invention, and a correlation between the relative standard deviation σ and a film fatigue according to one embodiment of the present invention.
Figure 5B:
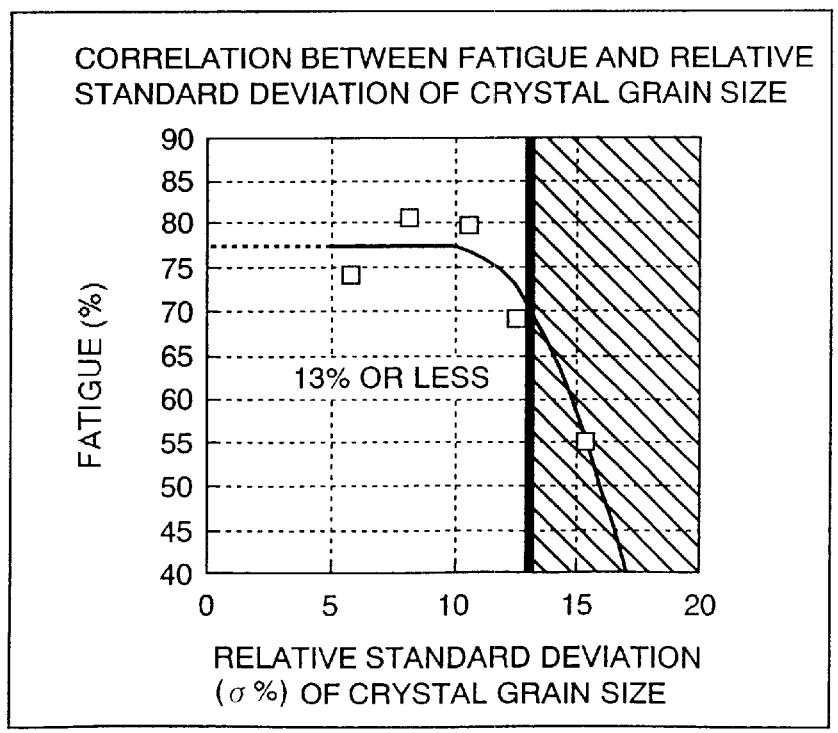

FIGS. 5A and 5B show a correlation between a relative standard deviation σ of crystal grain sizes and a remanent polarization value P and a correlation between the relative standard deviation σ of crystal grain sizes and a film fatigue, respectively. In these figures, the abscissa designates the relative standard deviation σ (unit: nm) of crystal grain sizes obtained by the above-described AFM on the basis of Numerical Formula 1. As is apparent from FIGS. 5A and 5B, for a relative standard deviation a of crystal grain sizes more than 13%, as the relative standard deviation σ becomes smaller, the remanent polarization value P becomes larger and the film fatigue becomes smaller (that is, the rewritable number becomes larger), while for a relative standard deviation σ of crystal grain sizes equal to or less than 13%, the remanent polarization value P is kept at a specific large value and the film fatigue is kept at a specific small value (that is, the rewritable number is kept at a specific large value).

(3) Surface Roughness of Ferroelectric Thin Film

Figure 6:
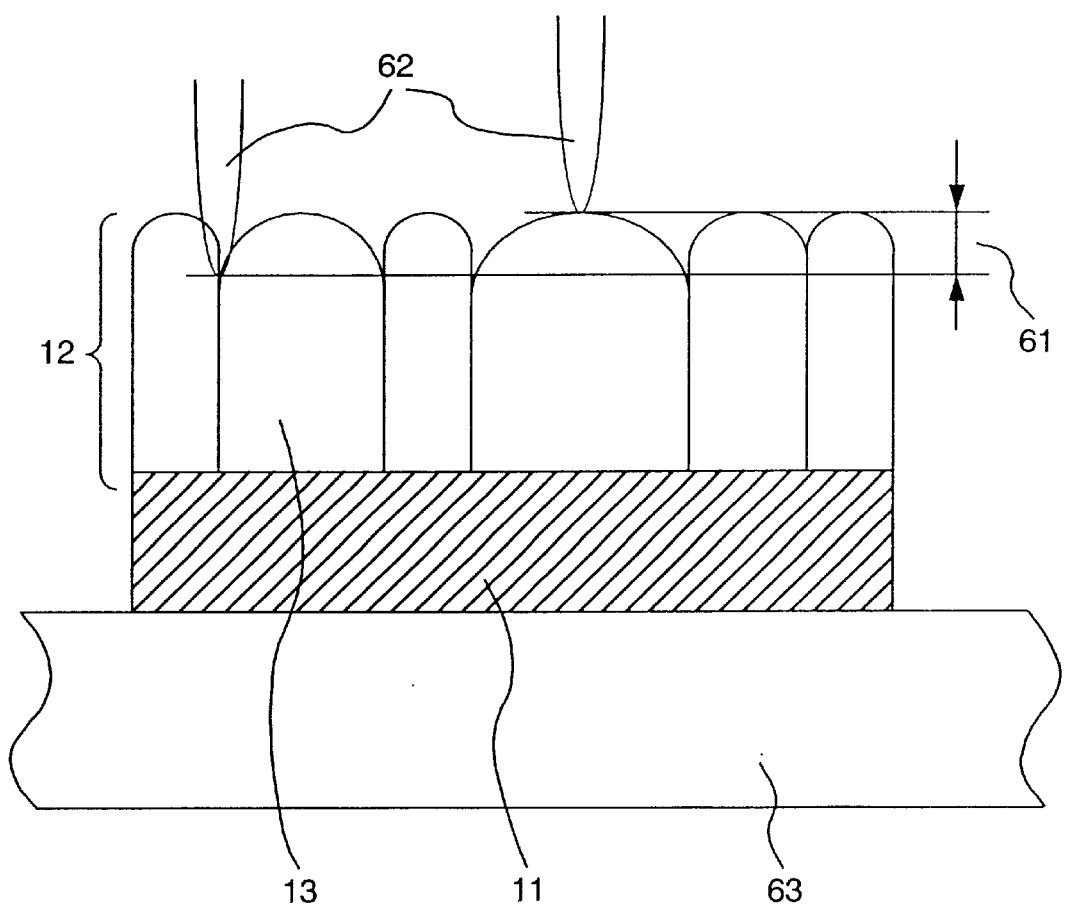
FIG. 6 is a schematic sectional view illustrating a method of measuring surface irregularities of a ferroelectric thin film by an AFM according to one embodiment of the present invention.

FIG. 6 is a schematic sectional view illustrating a method of measuring surface irregularities of a ferroelectric thin film using the AFM. Symbol's number 63 is a CMOS substrate. Symbol's number 11 is a lower electrode. Symbol's number 13 is a crystal grain. Symbol's number 12 is a ferroelectric thin film. Symbol's number 62 is an AFM probe. An AFM probe 62 is scanned on a ferroelectric thin film 12 while being subjected to vibration (tapping). At this time, on the surface of the ferroelectric thin film, a recessed portion, that is, a grain boundary portion is large vibrated, while a projecting portion, that is, a crystal grain portion is small vibrated. The amplitude of the vibration is converted into an electric signal, and the surface irregularities are measured on the basis of the electric signals, to thus obtain a surface roughness 61.

For the surface irregular shape (profile) of the ferroelectric thin film obtained by the AFM, SEM or TEM described in the first embodiment, the surface roughness of the ferroelectric thin film was estimated in accordance with the following manner.

Figure 7A:
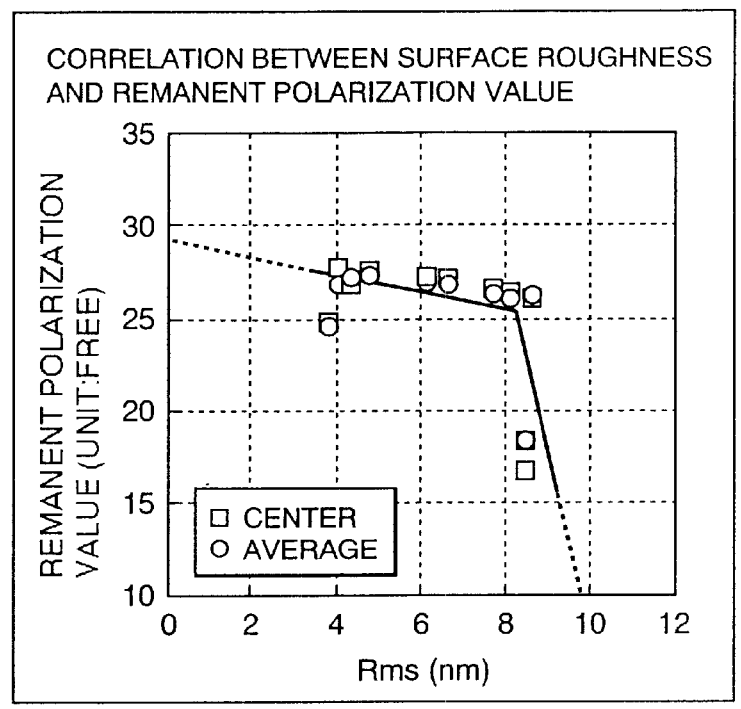
FIGS. 7A and 7B are diagrams showing a correlation between a surface roughness Rms and a remanent polarization value P according to one embodiment of the present invention, and a diagram showing a correlation between the surface roughness Rms and a film fatigue according to one embodiment of the present invention.
Figure 7B:
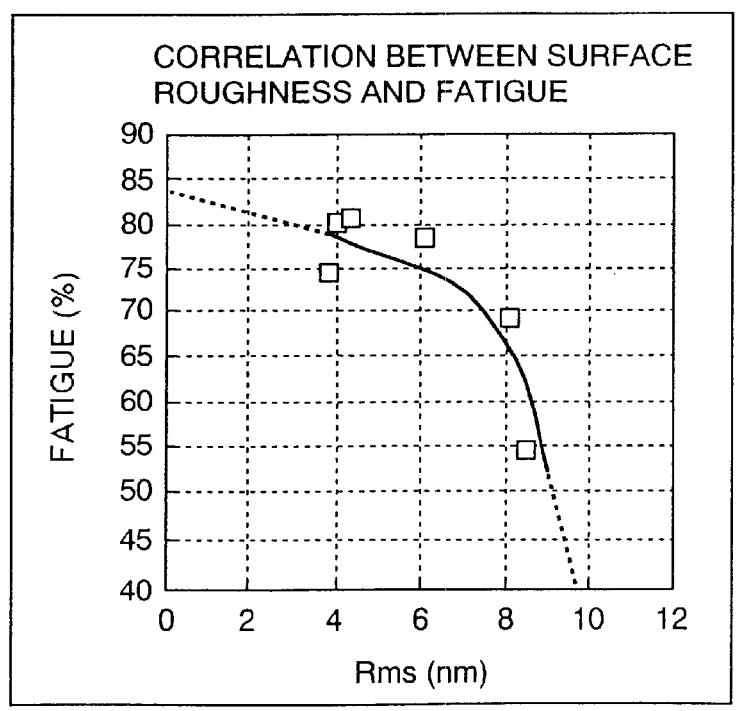

FIGS. 7A and 7B show a correlation between a surface roughness Rms and a remanent polarization value P and a correlation between the surface roughness Rms and a film fatigue according to one embodiment, respectively. In these figures, the abscissa designates the surface roughness Rms (unit: nm) calculated from surface irregularities measured by the AFM on the basis of Numerical Formula 2. As is apparent from FIGS. 7A and 7B, for a surface roughness Rms more than 10 nm, as the surface roughness Rms becomes smaller, the remanent polarization value P becomes larger and the film fatigue becomes smaller (that is, the rewritable number becomes larger), while for a surface roughness Rms equal to or less than 10 nm, the remanent polarization value P is kept at a specific large value.

$$Rms = \left( \sqrt{\frac{\sum_{i=1}^{N}(z_i - z_i(\text{ave}))^2}{N}} \right) \quad (2)$$

Rms: surface roughness (standard deviation)

N: number of measured data $z_i$: height of measured point "i"

$z_i(\text{ave})$: average value of $z_i$

In this embodiment, the surface roughness was expressed by a standard deviation of a difference between the maximum value and minimum value of overall data of surface irregularities measured by the AFM. In Numerical Formula 2, the surface roughness Rms is expressed by the standard deviation (unit: nm). Alternatively, the surface roughness is defined as a three-dimensional average surface roughness (unit: nm) with respect to a center plane (the volume formed by the plane and the surface shape projecting upwardly from the plane is equal to that formed by the plane and the surface shape projecting downwardly from the plane) as shown in Numerical Formula 3. The details are described in "Large-sized Sample SPM Observation System Operation Guide" (April, 1996) published by Touyo Technica.

$$Ra = \frac{1}{LxLy} \int_0^{Ly} \int_0^{Lx} f(x,y)\,dx\,dy \quad (3)$$

Ra: three-dimensional average surface roughness with respect to center plane

Lx: dimension of surface in x-direction

Figure 8A:
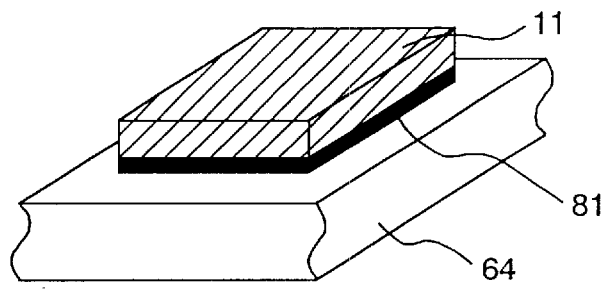
FIGS. 8A, 8B, 8C and 8D are flow charts showing a method of manufacturing a ferroelectric thin film according to one embodiment of the present invention.
Figure 8B:
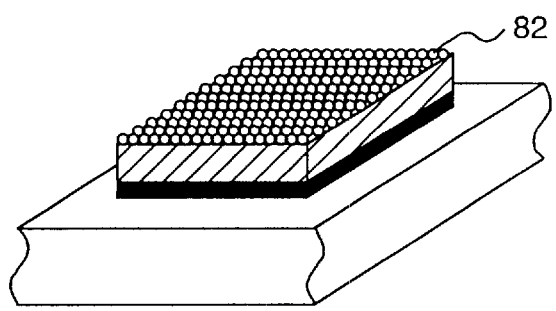
Figure 8C:
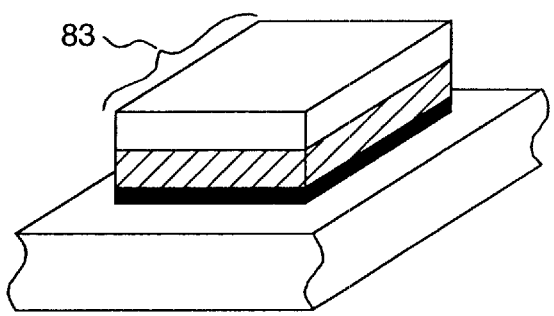
Figure 8D:
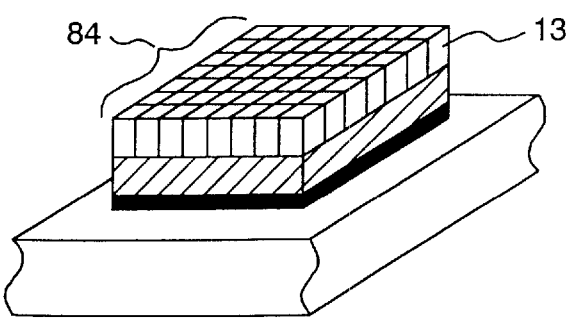

Ly: dimension of surface in y-direction f(x,y): roughness profile with respect to center plane (4) Method of Manufacturing Ferroelectric Thin Film FIGS. 8A to 8D shows a method of manufacturing a ferroelectric thin film according to one embodiment of the present invention. To obtain a ferroelectric thin film in which the relative standard deviation of crystal grain sizes is 13% or less, it is required to form initial nuclei necessary for growth of crystal grains. Prior to formation of a ferroelectric thin film, an extremely thin layer made from at least one or more of metals contained in a ferroelectric material or an oxide or compound containing the metals is provided by a sputtering method or solgel method, followed by heat-treatment at a high temperature to form initial nuclei 82 as shown in FIG. 8B. Alternatively, initial nuclei 82 necessary for forming micro-nuclei are formed by heat-treating a lower electrode at a high temperature after formation of the lower electrode, to precipitate at least one or more of metals contained in an adhesive layer 81 (disposed between the lower electrode 11 and a CMOS substrate 64) or an oxide or compound containing the metals on the surface of the lower electrode 11 (see FIG. 8B). Here, the initial nuclei 82 are made from an $ABO_3$ type oxide having a perovskite structure [composition: A=Pb, B=$(Zr_{1-x}, Ti_x)$; or A=$(Ba_{1-x}, Sr_x)$, B=Ti], or made from Ti, $TiO_x$, Sr, or $SrO_x$. A ferroelectric thin film (a ferroelectric thin film before crystallization) 83 is then formed on the initial nuclei 82 to a thickness required for a semiconductor memory device by the sputtering method or sol-gel method (see FIG. 8C). Then, the ferroelectric thin film 83 is subjected to rapid heat-treatment by a lamp using a RTA (Rapid Thermal Annealing) apparatus, with the result that a ferroelectric thin film after crystallization 84 is formed (see FIG. 8D). In this embodiment of the present invention, the heat-treatment is performed in a 100% $N_2$ atmosphere at 600° C. for 30 sec. With this heat-treatment, in the ferroelectric thin film 83, crystal grains have the perovskite structure and the (111) faces of crystal grains are preferentially oriented in the direction perpendicular to the substrate plane. According to the above-described manufacturing method, it is possible to obtain a ferroelectric thin film in which the (111) faces of crystal grains are preferentially oriented, the average crystal grain size is about 80 nm, the relative standard deviation of crystal grain sizes is about 13%, and the standard deviation of the surface roughness is about 10 nm. The ferroelectric thin film thus obtained is advantageous in suppressing growth of crystal grains having the pyrochlore structure and rosette-shaped $ZrO_x$ crystal grains causing deterioration of ferroelectric characteristics. As a result, a ferroelectric capacitor having a large remanent polarization value and a small film fatigue (large rewritable number) can be obtained by use of such a ferroelectric thin film.

Figure 9:
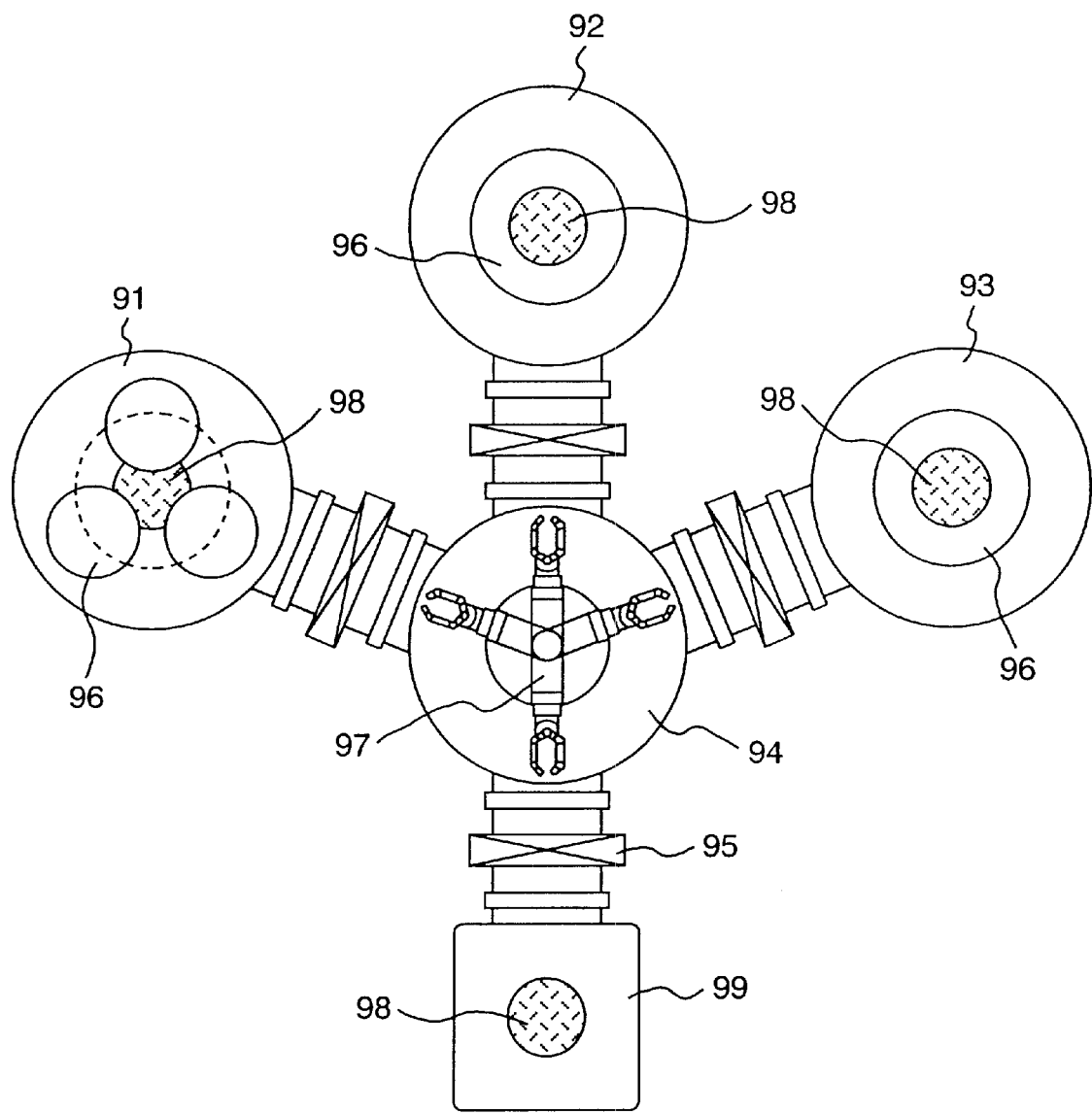
FIG. 9 is a top view showing one example of a film formation apparatus for manufacturing a ferroelectric capacitor of a semiconductor memory device according to one embodiment of the present invention.

FIG. 9 shows a film formation apparatus for manufacturing a ferroelectric thin film capacitor of a semiconductor memory device of the present invention. A substrate 1 carried from a substrate carrying in chamber 99 into a substrate exchange chamber 94, and carried among a film formation chamber (1) 91, film formation chamber (2) 92, and film formation chamber (3) 93 in a high vacuum atmosphere via the substrate exchange chamber 94 by a substrate exchange arm 97. For film formation in the film formation chamber (1) 91, a high frequency magnetron sputter system of a multi-cathode type is adopted; and for film formation in each of the film formation chamber (2) 92 and film formation chamber (3) 93, a DC magnetron sputter system of a single cathode type is adopted. Symbol's number 95 is a gate valve. Symbol's number 96 is a flat cathode. Symbol's number 98 is a Si substrate. In this embodiment, the ferroelectric layer 83 is formed by the sputter system of the multi-cathode type; however, it may be formed by the sputter system of the single cathode type. In this case, a sintered body of a mixture of a ferroelectric PZT and a lead oxide $Pbo_x$ may be used as a target. Further, the film formation may be performed by the sol-gel method or combination of the sol-gel method and the above-described sputtering.

(5) IC Card on Which Semiconductor Memory Including Ferroelectric Thin Film is Mounted IC cards uses various kinds of semiconductor memories depending on the applications thereof. A semiconductor memory using the ferroelectric thin film of the present invention is a nonvolatile memory. An IC card of the present invention is advantageous in terms of limitation of chip size, portableness, and maintenance free because any battery is not required to be contained for retention of data unlike a SRAM (Static Random Access Memory). Since the semiconductor memory including the ferroelectric thin film of the present invention can be manufactured at a high yield, the IC card of the present invention can be obtained at a low cost. Also since the rewritable number of the semiconductor memory of the present invention is made larger than that of an EEPROM (Electrically Erasable Programmable Read Only Memory) (rewritable number: $10^4$ to $10^5$) which is one kind of the nonvolatile memories, the service life of the IC card of the present invention is improved, to thereby reduce the running cost. One example of a simple system configuration of an IC card is described in "The whole of Nonerasable IC Memory RAM" (edited by Tomoji Kawai, published by Kougyou Chousa Kai, 1996) or Text of Realize Corporation's Advanced Technical Lecture entitled "Advanced Technology of Nonvolatile Ferroelectric Thin Film Memory and Problem Associated with Process Technology" (Realize Corporation, 1996).

(6) Computer on Which Semiconductor Memory Including Ferroelectric Thin Film is Mounted A computer on which a conventional DRAM (Dynamic Random Access Memory) is mounted cannot prevent erasing of working data due to cutoff of a power supply. On the contrary, the semiconductor memory using the ferroelectric thin film of the present invention is a nonvolatile memory, and accordingly, even in case of power failure, the computer of the present invention can retain the working state until directly before the power failure. The computer is not required to read the system or application every input of a power supply, and therefore, it can start work directly after input of the power supply. Further, since the computer is not required to contain any uninterruptive power supply or battery, it is possible to miniaturize the computer and to improve portableness of the computer due to reduction in weight or achieve space-saving thereof.

(7) Portable Information Terminal Apparatus on Which Semiconductor Memory Including Ferroelectric Thin Film is Mounted With respect to a portable telephone representative of a portable information terminal apparatus of the present invention, the semiconductor memory of the present invention contained in the portable telephone can be driven with a small power, and is not required to be provided with a power supply for retention of data because it is a nonvolatile memory. Accordingly, as compared with a conventional portable information terminal apparatus on which a DRAM, SRAM or EEPROM is mounted, the portable telephone of the present invention is advantageous in reducing the weight of the main body due to miniaturization of the integrated batter and making longer the drive time required for driving the main body without increasing the capacity of the battery.

(8) Video/Audio Apparatus on Which Semiconductor Memory Including Ferroelectric Thin Film is Mounted As compared with a conventional video camera containing a semiconductor memory device such as a DRAM, SRAM or EEPROM for recording video or audio information, a video camera representative of a video/audio apparatus of the present invention is advantageous in reducing the drive power for driving the integrated semiconductor memory device, and eliminating the necessity of provision of a power supply. This makes it possible to reduce the weight of the main body due to miniaturization of the integrated battery and to make longer the drive time required for driving the main body without increasing the capacity of the battery.

As fully described above, according to the present invention, it is possible to realize a ferroelectric capacitor capable of reducing a variation in characteristics between memory cells, and hence to obtain a high quality semiconductor memory device using the ferroelectric capacitor at a high manufacturing yield. The semiconductor memory device is a nonvolatile memory which makes it possible to eliminate the necessity of provision of a power supply for retention of data, save drive power, and improve the rewritable number. Accordingly, a system on which the semiconductor memory device of the present invention is mounted is capable of reducing the capacity of the inner power supply or eliminating the necessity of provision of the inner power supply, thereby realizing miniaturization of the system, increasing the service life thereof, and reducing the manufacturing cost thereof.

We claim:

1. A semiconductor memory device using a ferroelectric thin film capacitor as a memory capacitor, said capacitor comprising:

a stacked structure having at least a lower electrode, a ferroelectric thin film, and an upper electrode;

wherein crystal grains of said ferroelectric thin film have columnar shapes elongated substantially in parallel to the thickness direction of said ferroelectric thin film, and a relative standard deviation of crystal grain sizes of said crystal grains within a plane having a normal line in the film thickness direction is in a range of 13% or less.

2. A semiconductor memory device according to claim 1, wherein said columnar crystal grains do not have a grain boundary in the film thickness direction.

3. A semiconductor memory device according to claim 1, wherein a surface roughness of said ferroelectric thin flim is specified such that a difference between a maximum value and a minimum value with respect to an average plane of surface irregularities of said ferroelectric thin film is in a range of 40% or less of an average thickness of said ferroelectric thin film.

4. A semiconductor memory device according to claim 1, wherein a standard deviation of the surface roughness of said ferroelectric thin film is in a range of 10 nm or less.

5. A semiconductor memory device according to claim 1, wherein said ferroelectric thin film is made from an $ABO_3$ type oxide having a perovskite structure, and said ferroelectric thin film is formed such that the (111) faces of said crystal grains are preferentially oriented in a direction perpendicular to a substrate of said semiconductor memory device.

6. A semiconductor memory device according to claim 5, wherein said ferroelectric thin film is made from a material having a composition at least part of which contains a crystalline $ABO_3$ type oxide, an amorphous $ABO_3$ type oxide, or a mixture thereof, where A is at least one element selected from a group consisting of Pb, La, Sr, Nd and Ba; B is at least one element selected from a group consisting of Zr, Ti, Mn, Mg, Nb, Sn, Sb and In; and O is oxygen.

* * * * *